(12) United States Patent
Yamaji et al.

(10) Patent No.: US 10,161,987 B2
(45) Date of Patent: Dec. 25, 2018

(54) INSULATION DEGRADATION MONITORING DEVICE

(71) Applicant: MITSUBISHI ELECTRIC CORPORATION, Chiyoda-ku, Tokyo (JP)

(72) Inventors: Toru Yamaji, Tokyo (JP); Susumu Kozuru, Tokyo (JP); Nobukazu Nagayasu, Tokyo (JP); Takahiro Sasaki, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 2 days.

(21) Appl. No.: 15/323,859

(22) PCT Filed: Sep. 25, 2015

(86) PCT No.: PCT/JP2015/077029
§ 371 (c)(1),
(2) Date: Jan. 4, 2017

(87) PCT Pub. No.: WO2016/052314
PCT Pub. Date: Apr. 7, 2016

(65) Prior Publication Data
US 2017/0146588 A1    May 25, 2017

(30) Foreign Application Priority Data
Sep. 29, 2014   (JP) .................................. 2014-197915

(51) Int. Cl.
*G01R 31/12*   (2006.01)
*G01R 31/02*   (2006.01)
*G01R 19/165*  (2006.01)

(52) U.S. Cl.
CPC ....... *G01R 31/1245* (2013.01); *G01R 31/025* (2013.01); *G01R 31/1227* (2013.01); *G01R 19/165* (2013.01)

(58) Field of Classification Search
CPC .................................................... G01R 31/1245
(Continued)

(56) References Cited

U.S. PATENT DOCUMENTS 6,593,751 B2 *   7/2003   Takahashi ............ G01R 31/346
                                                            324/509
9,910,053 B2 *   3/2018   Bakhru ............... G01N 33/4905
(Continued)

FOREIGN PATENT DOCUMENTS

JP   S62-207974 A   9/1987
JP   03-048778 A    3/1991
(Continued)

OTHER PUBLICATIONS

International Search Report (PCT/ISA/210) dated Nov. 2, 2015, by the Japanese Patent Office as the International Searching Authority for International Application No. PCT/JP2015/077029.
(Continued)

*Primary Examiner* — Giovanni Astacio-Oquendo
(74) *Attorney, Agent, or Firm* — Buchanan Ingersoll & Rooney PC

(57) ABSTRACT

An insulation degradation monitoring device by which a degradation state of an insulator can be constantly monitored by a simple configuration, and a degradation degree can be decided. An insulation degradation monitoring device for an insulator, by which a high-voltage charging portion of an electric instrument is insulated from and supported to a grounding metal component, includes a penetration-type electric current sensor which is inserted to a connecting portion of the insulator and the grounding metal component,
(Continued)

and detects a leakage electric current which is passed from the high-voltage charging portion through the insulator and is flowed to the grounding metal component; and a decision means which is connected to an output side of the electric current sensor, and decides a degradation degree of the insulator in accordance with a value of the leakage electric current.

7 Claims, 3 Drawing Sheets

(58) Field of Classification Search
USPC .......................................... 324/500, 509, 512
See application file for complete search history.

(56) References Cited

U.S. PATENT DOCUMENTS

| | | | |
|---|---|---|---|
| 2013/0169286 A1 | 7/2013 | Phillips | |
| 2014/0266178 A1 | 9/2014 | Ausserlechner | |
| 2014/0320144 A1* | 10/2014 | Nakaya | H01M 10/54 324/434 |
| 2015/0253370 A1* | 9/2015 | Fantoni | G01R 31/11 702/58 |
| 2016/0131692 A1* | 5/2016 | Jaffrey | G01R 31/1272 324/544 |
| 2017/0264110 A1* | 9/2017 | Toya | H02J 7/0021 |

FOREIGN PATENT DOCUMENTS

| | | |
|---|---|---|
| JP | 3-127270 U | 12/1991 |
| JP | 04-262265 A | 9/1992 |
| JP | 5-034377 A | 2/1993 |
| JP | 9-213148 A | 8/1997 |
| JP | H10-241476 A | 9/1998 |
| JP | H11-304871 A | 11/1999 |
| JP | 2003-083831 A | 3/2003 |
| JP | 3757508 B2 | 3/2006 |
| JP | 3759219 B2 | 3/2006 |
| JP | 2006-266709 A | 10/2006 |
| JP | 2014-023401 A | 2/2014 |
| WO | WO 1998/016841 A1 | 4/1998 |
| WO | 2013/160991 A1 | 10/2013 |

OTHER PUBLICATIONS

Written Opinion (PCT/ISA/237) dated Nov. 2, 2015, by the Japanese Patent Office as the International Searching Authority for International Application No. PCT/JP2015/077029.

Office Action (Notification of Reason for Refusal) dated Feb. 6, 2018, by the Korean Patent Office in corresponding Korean Patent Application No. 10-2017-7006623 and English translation of the Office Action. (18 pages).

European Search Report dated May 3, 2018 issued by the European Patent Office in corresponding European Patent Application No. 15847716.6 (8 pages).

* cited by examiner

INSULATION DEGRADATION MONITORING DEVICE

BACKGROUND OF THE INVENTION

Technical Field

The present invention relates to an insulation degradation monitoring device which monitors a degradation state of an insulator supporting a charging portion of an electric instrument such as a power switchboard or the like.

Background Art

In an inner portion of a heavy electric instrument such as a power switchboard, there exist bus lines as well as many high-voltage charging portions of a main circuit instrument and the bus line and the high-voltage charging portions are supported at a grounding portion side by an insulator. The insulator is used during a long period in a state where the high-voltage charging portions are supported by the insulator, whereby an insulation capability is deteriorated, and a leakage electric current, which is flowed from a charging portion side through the insulator to the grounding portion side, is increased. When an inclement of the leakage electric current is left, the degradation of the insulator is more advanced, and the leakage electric current is a generation factor of a ground fault in a worst case. In order to previously prevent the ground fault, it is required that a degradation state of the insulator is monitored, and the insulator is replaced at a suitable period. Suitable replacement timing is required for effective operation of an electric power receiving and transforming facility.

As a conventional art for detecting a degradation degree of an insulator in an electric power receiving facility, for example, there is a known art by which dust in an electric power receiving panel is collected, and a surface resistivity of the insulator is calculated in accordance with a value of an ion, which is included in the dust, a temperature and a humidity history, and moreover, a remaining life of the insulator is estimated in accordance with a threshold value which is determined in accordance the surface resistivity of the insulator and a surface resistivity of a new insulator, a usage lapse age of the insulator, and an amount of the dust, whereby a suitable replacement timing is decided (for example, refer to Patent Document 1).

Moreover, there is a known art by which an electric conductor is provided at an interphase portion of an insulation frame, in which a three-phase vacuum circuit breaker is installed, and the electric conductor is connected to a grounding metal, and a leakage electric current, which is passed through the outside or the inside of the insulation frame and is flowed to an interphase portion of a charging portion in accordance with an insulation degradation of the insulation frame, is led to an insulation metal via the electric conductor, and a ground-fault relay is operated and a leakage electric current of the relay is detected, whereby an insulation degradation degree is grasped (for example, refer to Patent Document 2).

CONVENTIONAL ART DOCUMENT

Patent Document

Patent Document 1: Japanese Laid-Open Patent Publication No. 2014-23401 (Page 3, FIG. 1)
Patent Document 2: Japanese Laid-Open Patent Publication No. 2003-83831 (Page 3, FIG. 1 through FIG. 3)

SUMMARY OF THE INVENTION

Problems to be solved by the Invention

In a method which is described in the Patent Document 1, an electric power failure of an electric power receiving and transforming facility is required in order to collect dust which adheres to a surface of an insulator, and periodic maintenance work such as cleaning of the insulator is required. All the aforementioned facts cause to disturbance of facility operations. In order to avoid the problem, there is a described technology in which a correlation between an amount of dust at a floor surface of a board and an amount of the dust at the surface of the insulator is grasped, and the amount of the dust at the surface of the insulator is estimated in accordance with the dust which is collected from the floor surface. However, even in this case, it is required that the dust is collected at every time when the dust is measured, and moreover, there has been a problem in that many work operations, in which a value of an ion, which is included in the dust, and data of a temperature and a humidity are obtained, are required.

Moreover, although a degradation monitoring technology, which is described in the Patent Document 2, is effective for an insulation monitoring of an insulation frame in which a three-phase vacuum circuit breaker is installed, it is difficult that an insulator, which is deteriorated, is identified in a configuration in which many insulators, which support a high-voltage charging portion, are arranged in, for example, a cabinet of a power switchboard which is grounded, and there has been a problem in that the degradation monitoring technology is applied to a general insulator which supports a charging portion.

The present invention has been made to solve above-described problems, and an object of the invention is to obtain an insulation degradation monitoring device by which a degradation state of an insulator can be constantly monitored by a simple configuration even when a plurality of insulators, which support a high-voltage charging portion as a power switchboard, are included, and a degradation degree can be decided.

Means for Solving Problems

An insulation degradation monitoring device of the present invention, for an insulator, by which a high-voltage charging portion of an electric instrument is insulated from and supported to a grounding metal component, includes an electric current sensor which is inserted to a connecting portion of the insulator and the grounding metal component, and detects a leakage electric current which is passed from the high-voltage charging portion through the insulator and is flowed to the grounding metal component; and a decision means which is connected to an output side of the electric current sensor, and decides a degradation degree of the insulator in accordance with a value of the leakage electric current.

Effects of the Invention

According to an insulation degradation monitoring device of the present invention, the insulation degradation monitoring device includes an electric current sensor which detects a leakage electric current which is passed from a high-voltage charging portion to an insulator and is flowed to a grounding metal component, and a decision means which decides a degradation degree of the insulator in accordance with a value of the detected leakage electric current, so that the leakage electric current, which is passed from the high-voltage charging portion through the insulator and is flowed to the grounding metal component, can be constantly monitored, and the degradation degree of the insulator can be decided in accordance with an increment of the leakage electric current, whereby timing for replacing the insulator can be estimated before a ground fault or the like is caused.

Moreover, the insulation degradation monitoring device can be easily applied to each insulator in an electric instrument having a plurality of insulators, so that an insulator, which is deteriorated, is easily identified.

MODE FOR CARRYING OUT THE INVENTION

Embodiment 1

Figure 1:
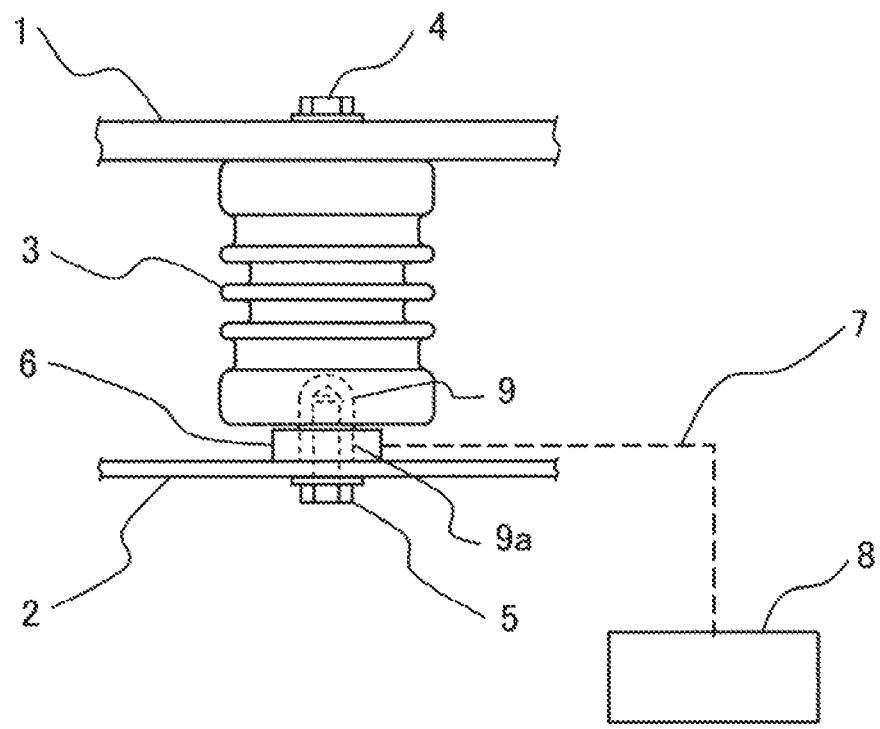
FIG. 1 is a front view illustrating an insulation degradation monitoring device according to Embodiment 1 of the present invention.
Figure 2:
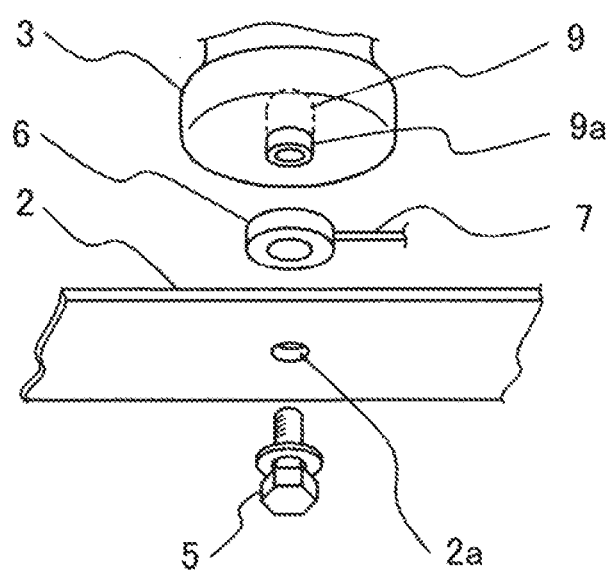
FIG. 2 is a disassembled oblique perspective view illustrating a detail of an attachment portion at a grounding side of the insulation degradation monitoring device in FIG. 1.

FIG. 1 is a front view illustrating an insulation degradation monitoring device according to Embodiment 1. FIG. 2 is a detailed view illustrating an attachment portion at a grounding side of the insulation degradation monitoring device in FIG. 1, and FIG. 2 is a disassembled oblique perspective view in which the insulation degradation monitoring device in FIG. 1 is viewed from a lower direction.

FIG. 1 indicates an example of an insulator, as an insulator which is an object of a degradation monitoring, which supports a charging portion of an electric instrument of a power switchboard or the like, and a high-voltage charging portion 1 is a bus line or a main circuit conductor. A grounding metal component 2 is a part of a cabinet of a power switchboard, or is a supporting metal component or the like, which is fixed to the cabinet, and the grounding metal component 2 is grounded. Moreover, an insulator 3 is, for example, a supporting insulator. The high-voltage charging portion 1 is supported by and fixed to the grounding metal component 2 via the insulator 3.

The high-voltage charging portion 1 is fixed to the insulator 3 by using a charging portion fixing bolt 4. Moreover, the insulator 3 and the grounding metal component 2 are fixed by using a grounding portion fixing bolt 5.

An electric current sensor 6 is arranged at a connecting portion of the insulator 3 and the grounding metal component 2. The electric current sensor 6 is composed of a penetration-type electric current detector having an annular shape, and in particular, the electric current sensor 6 is, for example, a small penetration-type CT, and detects a minute leakage electric current which is passed from the high-voltage charging portion 1 through the insulator 3 and is flowed to the grounding metal component 2.

An output side, which is a secondary side of the electric current sensor 6, is connected to a decision means 8 via a lead wire 7. The decision means 8 is provided in, for example, a control section of an electric instrument, in which the high-voltage charging portion 1 and the insulator 3 are installed.

Hereinafter, a detailed configuration of an attachment portion, by which the electric current sensor 6 is attached to the grounding metal component 2, will be explained in reference to FIG. 2.

A buried metal 9, which is composed of a metal component having a cylindrical shape, is buried at an end portion of the insulator 3 which is connected to the grounding metal component 2. A female screw for attaching is processed at a center of the buried metal 9. A protruded portion 9a is formed at a facing side of the buried metal 9 toward the grounding metal component 2, in a state where an end portion at an attachment side is protruded from an end surface of the insulator 3. It is desirable that a protrusion length of the protruded portion 9a is slightly longer than a thickness of the electric current sensor 6. An outer diameter of the protruded portion 9a is smaller than a thickness of the electric current sensor 6 having an annular shape, whereby it is possible that the electric current sensor 6 is easily fitted to the protruded portion 9a.

In addition, although it is general that a buried metal is provided at a connecting portion side of the insulator 3 toward the high-voltage charging portion 1, the buried metal is not a main portion, so that an illustration and an example are omitted.

In an assembling process, firstly, a screw hole of the buried metal 9 is fitted to a mounting hole 2a of the grounding metal component 2, and the grounding metal component 2 is tightened and fixed by the grounding portion fixing bolt 5, in a state where the electric current sensor 6 is fitted to the protruded portion 9a of the buried metal 9 which is buried in the insulator 3. A protrusion length of the protruded portion 9a is longer than a thickness of the electric current sensor 6, whereby the insulator 3 and the grounding metal component 2 are fixed in a state where the insulator 3 and the grounding metal component 2 are certainly contacted at a tip of the protruded portion 9a of the buried metal 9, and a load is not applied to the electric current sensor 6 by tightening the grounding metal component 2, and the protruded portion 9a is used as a passage of a leakage electric current.

The lead wire 7 of the electric current sensor 6 is connected to the decision means 8. The lead wire 7 is bundled to the grounding metal component 2 or the like, and the lead wire 7 is wired in a state where an insulation distance is maintained with respect to a charging portion. A state, after the assembling process is performed, is indicated as FIG. 1.

Hereinafter, an operation of the insulation degradation monitoring device will be explained.

An insulation capability of the insulator 3, which supports the high-voltage charging portion 1, is decreased in accordance with an aged deterioration which is caused by using the insulator 3 for the long term. Thereby, a leakage electric current, which is flowed from the high-voltage charging portion 1 to a grounding side, is increased.

Therefore, the leakage electric current is constantly monitored by the electric current sensor 6, and the degradation of the insulator 3 is monitored by checking a variation of the leakage electric current.

The leakage electric current is passed through the insulator 3 and is flowed from the high-voltage charging portion 1 to the grounding metal component 2. The insulator 3 is fixed in a state where a tip of the protruded portion 9a of the buried metal 9 and the grounding metal component 2 are contacted, so that the leakage electric current, which is passed from the insulator 3, is flowed to the grounding metal component 2 via the protruded portion 9a.

The electric current sensor 6 is provided in a state where the electric current sensor 6 is penetrated by the protruded portion 9a, and a surface of the electric current sensor 6 is insulated, so that a minute leakage electric current, which is flowed from the insulator 3 to the grounding metal component 2, is intensively flowed to the protruded portion 9a of the buried metal 9 of which electric resistance is low, and the leakage electric current is passed through the inside of the electric current sensor 6. Therefore, the minute leakage electric current can be easily detected, with high accuracy, by the electric current sensor 6.

A value of the leakage electric current, which is detected by the electric current sensor 6, is inputted to the decision means 8 via the lead wire 7. Correlation data, which is previously obtained, between the leakage electric current of the insulator 3 and a degradation degree is memorized in the decision means 8. In this case, the leakage electric current is compared with the correlation data, and when the value of the leakage electric current, which is detected by the electric current sensor 6, exceeds a predetermined value, it is decided that the degradation of the insulator 3 proceeds, and the leakage electric current is used for a guideline of cleaning or replacement of the insulator 3.

Figure 3:
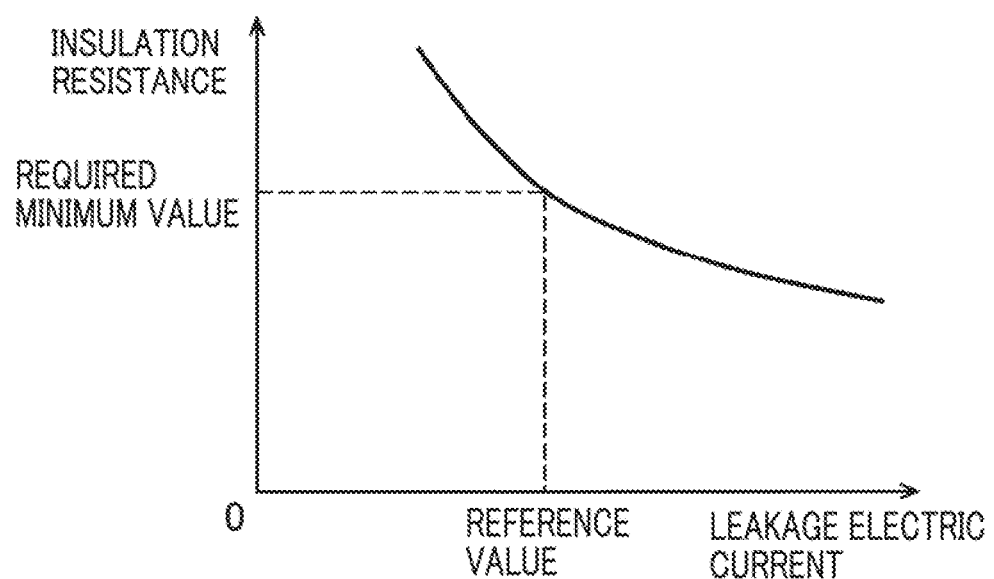
FIG. 3 is an explanatory view for explaining an example of a decision method for insulation degradation.

An example of a decision method by the decision means 8 will be explained in reference to FIG. 3. FIG. 3 is an explanatory view for explaining an example of a decision method for insulation degradation. If the degradation of the insulator 3 proceeds, an insulation resistance of the insulator 3 is decreased. Therefore, an insulation resistance value is used as a parameter of a degradation degree. There is a correlation, which is indicated by a thick line in FIG. 3, between the insulation resistance of the insulator 3 and the leakage electric current. Correlation data, which is indicated in FIG. 3, is previously obtained with respect to the insulator 3 which is a monitored object. Moreover, a value of a leakage electric current with respect to a required minimum value of an insulation resistance, which is required for maintaining an insulation capability, is determined as a reference value, and the values are memorized in a memory unit of the decision means 8.

In addition, the reference value or the like is different in accordance with a shape, the quality of a material or the like of the insulator 3, so that the correlation data is obtained for each of insulators of which kinds are different. Moreover, it is suitable that the required minimum value is determined in accordance with, for example, a replacement recommendable period or a cleaning recommendable period.

When the value of the leakage electric current, which is detected by the electric current sensor 6, exceeds a reference value, it is decided that the degradation of the insulator 3 proceeds more than predetermined degradation, and, for example, a replacement recommendable period of the insulator 3 is reached, whereby the replacement of the insulator 3 can be prepared.

Although it is general that many insulators, which support the high-voltage charging portion 1, are used at a plurality of positions in an inner portion of an electric instrument, a similar insulation degradation monitoring device is provided for an insulator to which a monitoring operation is required, whereby a deteriorated insulator can be easily identified. It is suitable that only a small electric current sensor is provided with respect to the insulator 3, so that the insulator 3 is simply disposed.

In the above-described explanation, although the insulator 3 is explained as a supporting insulator, the insulator 3 is not limited to the supporting insulator, and when the insulator 3 is an insulator by which the high-voltage charging portion 1 is supported and fixed to the grounding metal component 2, the insulator 3 can be applied to a general insulation supporting component of an electric instrument. A material of the insulator 3 is not particularly limited, and the insulator 3 can be widely applied to an insulation material, which is generally known, such as a ceramic or an epoxy resin.

Moreover, although the electric current sensor 6 is explained as a penetration-type CT, for example, a Rogowski coil may be used for the electric current sensor 6 in the other case.

As described above, according to Embodiment 1, the insulation degradation monitoring device for an insulator, by which a high-voltage charging portion of an electric instrument is insulated from and supported to a grounding metal component, includes an electric current sensor which is inserted to a connecting portion of the insulator and the grounding metal component, and detects a leakage electric current which is passed from the high-voltage charging portion through the insulator and is flowed to the grounding metal component, and a decision means which is connected to an output side of the electric current sensor, and decides a degradation degree of the insulator in accordance with a value of the leakage electric current, so that the leakage electric current, which is passed from the high-voltage charging portion through the insulator and is flowed to the grounding metal component, can be constantly monitored, and the degradation degree of the insulator can be decided in accordance with an increment of the leakage electric current. Therefore, the insulation degradation can be early discovered, and timing for replacing the insulator can be estimated before a ground fault or the like is caused.

Moreover, even in an electric instrument which includes a plurality of insulators, an electric current sensor can be easily disposed, and a deteriorated insulator can be easily identified.

Moreover, the buried metal, which includes a screw hole for attaching, is provided at an end portion of the insulator, which is connected to the grounding metal component, and a facing side of the buried metal toward the grounding metal component is formed as a protruded portion which is protruded from an end surface of the insulator, and the electric current sensor is composed of a penetration-type electric current detector, and the electric current sensor is penetrated by the protruded portion so as to be arranged between the insulator and the grounding metal component, whereby a leakage electric current is intensively flowed to the protruded portion of the buried metal, of which electric resistance is low, and is passed through the inside of the electric current sensor, so that detection accuracy of the leakage electric current is improved. Moreover, the electric current sensor can be easily attached to a connecting portion of the insulator and the grounding metal component, and the insulation degradation monitoring device, of which assembling workability is excellent, can be obtained.

Embodiment 2

Figure 4:
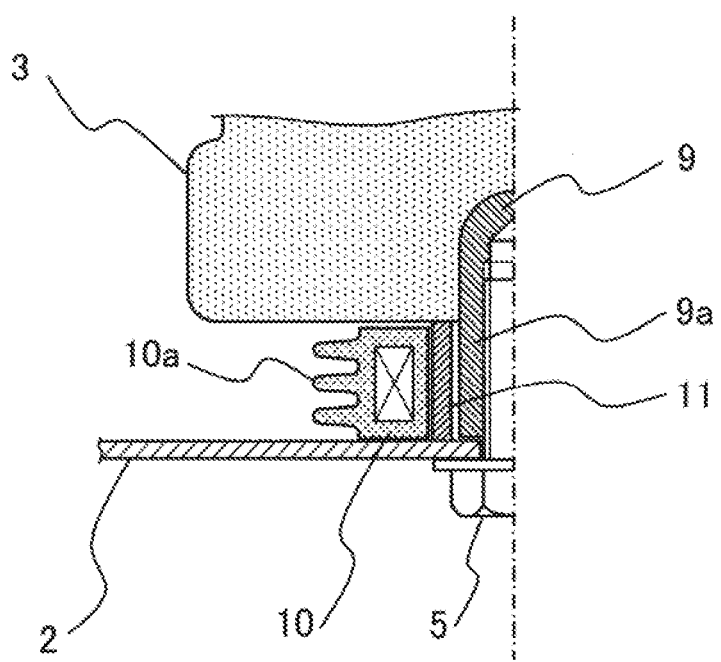
FIG. 4 is a partial cross-sectional view illustrating an electric current sensor of an insulation degradation monitoring device according to Embodiment 2.

FIG. 4 is a partial cross-sectional view illustrating an electric current sensor of an insulation degradation monitoring device, for an insulator, according to Embodiment 2. A dot-and-dash line in FIG. 4 is an axis symmetric line, and FIG. 4 indicates only a left half portion of the electric current sensor. Parts in FIG. 4, which are equivalent to parts in FIG. 1 and FIG. 2 according to Embodiment 1, are indicated by the same symbols, and detailed explanations are omitted, and difference points will be mainly explained. In addition, a lead wire 7 and a decision means 8, which are connected to the electric current sensor, are omitted.

As illustrated in FIG. 4, a plurality of pleats 10a is provided at an outer circumferential portion of an electric current sensor 10 according to Embodiment 2. As illustrated in FIG. 4, the outside of a coil at a center portion is covered by an insulation component at a cross section of the electric current sensor 10, so that the pleats 10a are provided at an outer circumference side of the insulation component.

Moreover, a conductive sleeve 11, which is composed of a conductive component having a cylindrical shape, of which electric resistance is low, is inserted to a gap between an inner circumference side of the electric current sensor 10 and an outer circumference side of a protruded portion 9a.

In a size relation among a protrusion length of the protruded portion 9a of the buried metal 9, a height of the electric current sensor 10, and a length of the conductive sleeve 11, the length of the conductive sleeve 11 is the longest, and the protrusion length of the protruded portion 9a and the height of the electric current sensor 10 are shorter than the length of the conductive sleeve 11. Thereby, in an attachment state which is indicated in FIG. 4, the electric current sensor 10 is configured in such a way that one end portion of the conductive sleeve 11 is contacted to an insulator 3, and the other end portion of the conductive sleeve 11 is contacted to a grounding metal component 2.

Hereinafter, an operation of the insulation degradation monitoring device will be explained.

The pleats 10a are provided at the outer circumferential portion of the electric current sensor 10, whereby a creepage distance of the outer circumferential portion is longer than a creepage distance of the inner circumferential portion. Therefore, if the insulator 3 and the electric current sensor 10 are contacted, a leakage electric current is mainly passed through the inner circumferential portion of the electric current sensor 10.

Moreover, the conductive sleeve 11 is provided at the inside of the electric current sensor 10, and the insulator 3 and the conductive sleeve 11, and the conductive sleeve 11 and the grounding metal component 2 are certainly contacted, whereby a leakage electric current is passed through the conductive sleeve 11, of which electric resistance is low, and is flowed to the grounding metal component 2. Thereby, the leakage electric current is more certainly passed through the inside of the electric current sensor 10, and a minute leakage electric current, which is flowed to the insulator 3, can be detected with high accuracy by the electric current sensor 10, so that an insulation degradation state of the insulator 3 can be certainly decided.

Moreover, the protruded portion 9a is contacted to the grounding metal component 2 via the conductive sleeve 11, so that when a protrusion length of the protruded portion 9a is shorter than a length of the conductive sleeve 11, it is not particularly required that a size is controlled, and the insulation degradation monitoring device is simply made.

Moreover, even when an existing insulator does not include a protruded portion at a buried metal, it is possible that the conductive sleeve 11 is inserted at a later timing, and the electric current sensor is attached.

In addition, in FIG. 4, although the insulation degradation monitoring device has a configuration in which the pleats 10a are provided at an outer circumferential portion of an electric current sensor 10, and the conductive sleeve 11 is included, it is suitable that the insulation degradation monitoring device has a configuration in which the conductive sleeve 11 is not included and only the pleats 10a are provided, or has a configuration in which the pleats 10a are not provided and only the conductive sleeve 11 is included. In this case, each of effects can be respectively obtained.

As described above, in the insulation degradation monitoring device according to Embodiment 2, a plurality of pleats are provided at an outer circumferential portion of the electric current sensor, so that a leakage electric current is mainly passed through an inner circumference side of the electric current sensor, whereby detection accuracy of the leakage electric current, which is detected by the electric current sensor, is improved.

Moreover, the insulation degradation monitoring device is configured in such a way that the conductive sleeve having a cylindrical shape is inserted to an inner circumference side of the electric current sensor, and one end portion of the conductive sleeve is contacted to the insulator, and the other end portion of the conductive sleeve is contacted to the grounding metal component, so that the leakage electric current is passed through the conductive sleeve, of which electric resistance is low, and is flowed to the grounding metal component, whereby the leakage electric current is certainly passed through the inside of the electric current sensor, and the leakage electric current, which is flowed to the insulator, can be detected with high accuracy, and an insulation degradation state of the insulator can be decided with high accuracy.

Embodiment 3

Figure 5:
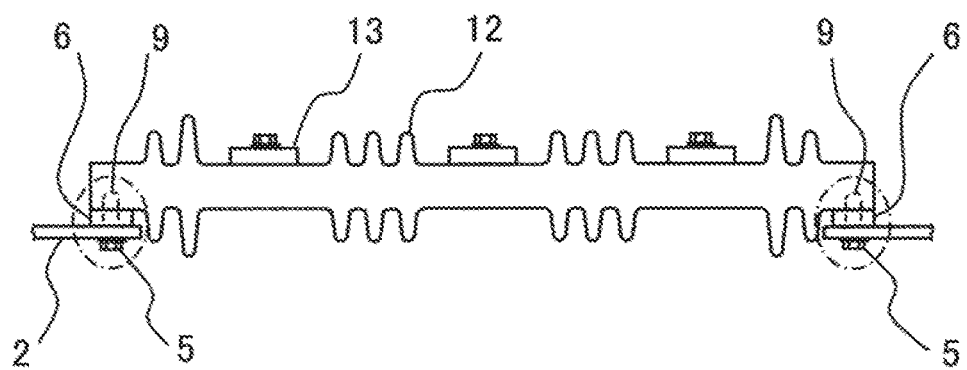
FIG. 5 is a front view illustrating an insulation degradation monitoring device according to Embodiment 3.

FIG. 5 is a view illustrating an insulation degradation monitoring device according to Embodiment 3. Parts in FIG. 5, which are equivalent to parts in FIG. 1 and FIG. 2, are indicated by the same symbols, and explanations are omitted. Lead wires 7 and decision means 8, which are connected to electric current sensors 6, are omitted.

An insulator 12, which is a monitored object according to Embodiment 3, supports, for example, a plurality of high-voltage charging portions 13, and the insulator 12 is supported by and fixed to grounding metal components 2 at a plurality of portions (two portions at both sides in FIG. 5). As a specific example of an electric instrument in which the insulator 12 is used, for example, switchgear or the like, in which breakers and a bus line are arranged in a cabinet, is estimated, and the specific example is a case in which the three-phase high-voltage charging portions 13, which are connected to the three-phase breakers, are attached to the grounding metal components 2 at the cabinet side via the insulator 12.

As illustrated in FIG. 5, the high-voltage charging portions 13, which are, for example, three-phase main circuit conductors, are supported by and fixed to one insulator 12, and two portions at both sides of the insulator 12 are attached to the grounding metal components 2. In this case, parts, which are surrounded by a dot-and-dash line in FIG. 5, are fixed by a similar way for the attachment portion according to Embodiment 1 in such way that the electric current sensors 6 are penetrated by protruded portions 9a (not illustrated) of buried metals 9 which are provided at a side of the insulator 12. In addition, it is suitable that the configuration of the attachment portion in FIG. 4 according to Embodiment 2 is adopted for a configuration of an attachment portion according to Embodiment 3.

The insulation degradation monitoring device is configured as described above, whereby a leakage electric current is passed through any of the left and right electric current sensors 6, or is passed through the both electric current sensors 6. Therefore, the leakage electric current, which is detected by a plurality of electric current sensors 6, is inputted to one decision means (not illustrated), and a value of the leakage electric current is integrated, whereby an electric current value of the leakage electric current, which is passed through one insulator 12, is obtained. Correlation data, which is previously obtained, between the leakage electric current and a degradation degree is memorized in the decision means 8, and the degradation degree of the insulator 12 is decided in the decision means 8 by, for example, the method which is explained in Embodiment 1.

As described above, in the insulation degradation monitoring device according to Embodiment 3, the insulator and the grounding metal component are connected at a plurality of portions and include a plurality of connecting portions, and the electric current sensors are provided at each of the plurality of connecting portions, and values of the leakage electric currents, which are detected at the plurality of connecting portions, are integrated at the decision means, and a degradation degree of the insulator is decided in accordance with the values of the leakage electric currents, which are integrated, so that the decision means is applied to the insulator, in which the connecting portions for the grounding metal component are provided at a plurality of potions, and an effect, which is similar to the effect according to Embodiment 1, can be obtained.

In addition, in the scope of the present invention, it is possible that each of embodiments is freely combined, or each of embodiments is suitably modified or omitted.

DESCRIPTION OF THE SYMBOLS

"1" is a high-voltage charging portion; "2," a grounding metal component; "2a," a mounting hole; "3," an insulator; "4," a charging portion fixing bolt; "5," a grounding portion fixing bolt; "6," an electric current sensor; "7," a lead wire; "8," a decision means; "9," a buried metal; "9a," a protruded portion; "10," an electric current sensor; "10a," pleats; "11," a conductive sleeve; "12," an insulator; "13," high-voltage charging portions.

What is claimed is:

1. An insulation degradation monitoring device for an insulator, by which a high-voltage charging portion of an electric instrument is insulated from and supported to a grounding metal component, comprising:
   an electric current sensor having an annular shape which is inserted to a connecting portion of the insulator and the grounding metal component, and detects a leakage electric current which is passed from the high-voltage charging portion through the insulator and is flowed to the grounding metal component; and
   a controller connected to an output side of the electric current sensor, and decides a degradation degree of the insulator in accordance with a value of the leakage electric current; wherein
   a buried metal having a screw hole for attaching is provided at an end portion of the insulator on the grounding metal component side, and at an end of the buried metal facing to the grounding metal component, a protruded portion which is protruded with a slightly longer length than a thickness of the electric current sensor, from an end surface of the insulator, is formed, and the protruded portion is configured in such a way that the outside shape of the protruded portion is smaller than an inner diameter of the electric current sensor,
   and the electric current sensor is arranged between the insulator and the grounding metal component in a state where the electric current sensor is fitted to the protruded portion of the buried metal.

2. The insulation degradation monitoring device as recited in claim 1, wherein a plurality of pleats are provided at an outer circumferential portion of the electric current sensor.

3. The insulation degradation monitoring device as recited in claim 2, wherein
   a conductive sleeve having a cylindrical shape is inserted to an inner circumference side of the electric current sensor, and one end portion of the conductive sleeve is contacted to the insulator, and the other end portion of the conductive sleeve is contacted to the grounding metal component.

4. The insulation degradation monitoring device as recited in claim 1, wherein
   a conductive sleeve having a cylindrical shape is inserted to an inner circumference side of the electric current sensor, and one end portion of the conductive sleeve is contacted to the insulator, and the other end portion of the conductive sleeve is contacted to the grounding metal component.

5. The insulation degradation monitoring device as recited in claim 1, wherein
   the insulator and the grounding metal component are connected at a plurality of portions, and the insulator and the grounding metal component include a plurality of connecting portions, and
   the electric current sensor is provided at each of the plurality of connecting portions, and
   a value of the leakage electric current, which is detected at the plurality of connecting portions, is integrated at the controller, and a degradation degree of the insulator is decided in accordance with the value of the integrated leakage electric current.

6. An insulation degradation monitoring device for an insulator, by which a high-voltage charging portion of an electric instrument is insulated from and supported to a grounding metal component, comprising:
   an electric current sensor which is inserted to a connecting portion of the insulator and the grounding metal component, and detects a leakage electric current which is passed from the high-voltage charging portion through the insulator and is flowed to the grounding metal component; and
   a controller connected to an output side of the electric current sensor, and decides a degradation degree of the insulator in accordance with a value of the leakage electric current; wherein
   a plurality of pleats are provided at an outer circumferential portion of the electric current sensor.

7. The insulation degradation monitoring device as recited in claim 6, wherein
   the insulator and the grounding metal component are connected at a plurality of portions, and the insulator and the grounding metal component include a plurality of connecting portions, and
   the electric current sensor is provided at each of the plurality of connecting portions, and
   a value of the leakage electric current, which is detected at the plurality of connecting portions, is integrated at the controller, and a degradation degree of the insulator is decided in accordance with the value of the integrated leakage electric current.

* * * * *